(12) United States Patent
Kim et al.

(10) Patent No.: US 11,662,659 B2
(45) Date of Patent: May 30, 2023

(54) PHOTOMASK, EXPOSURE APPARATUS, AND METHOD OF FABRICATING THREE-DIMENSIONAL SEMICONDUCTOR MEMORY DEVICE USING THE SAME

(71) Applicant: SAMSUNG ELECTRONICS CO., LTD., Suwon-si (KR)

(72) Inventors: Donghwan Kim, Suwon-si (KR); Woosung Kim, Suwon-si (KR); Gunwoo Park, Hwaseong-si (KR); Ki-Bong Seo, Suwon-si (KR); Jang-Hwan Jeong, Seongnam-si (KR)

(73) Assignee: SAMSUNG ELECTRONICS CO., LTD.

( * ) Notice: Subject to any disclaimer, the term of this patent is extended or adjusted under 35 U.S.C. 154(b) by 87 days.

(21) Appl. No.: 17/306,644

(22) Filed: May 3, 2021

(65) Prior Publication Data
US 2022/0128900 A1 Apr. 28, 2022

(30) Foreign Application Priority Data
Oct. 27, 2020 (KR) .......................... 10-2020-0140658

(51) Int. Cl.
*G03F 1/38* (2012.01)
*H01L 21/027* (2006.01)
*H01L 21/768* (2006.01)
*G03F 7/20* (2006.01)

(52) U.S. Cl.
CPC ............ *G03F 1/38* (2013.01); *G03F 7/70283* (2013.01); *H01L 21/0274* (2013.01); *H01L 21/76805* (2013.01); *H01L 21/76816* (2013.01); *H01L 21/76877* (2013.01); *H01L 21/76895* (2013.01)

(58) Field of Classification Search
CPC ....... H01L 21/776895; H01L 21/76877; H01L 21/76816; H01L 21/76805; H01L 21/0274; G03F 7/70283; G03F 1/38
See application file for complete search history.

(56) References Cited

U.S. PATENT DOCUMENTS

| | | | |
|---|---|---|---|
| 5,547,788 A | 8/1996 | Han et al. | |
| 6,013,395 A | 1/2000 | Matsuura | |
| 7,439,187 B2 | 10/2008 | Ono et al. | |
| 8,778,572 B2 | 7/2014 | Fukuhara et al. | |
| 2005/0031967 A1* | 2/2005 | Ito | G03F 1/70 430/394 |

(Continued)

FOREIGN PATENT DOCUMENTS

| | | |
|---|---|---|
| JP | H075675 A | 1/1995 |
| JP | H10232482 A | 9/1998 |

(Continued)

*Primary Examiner* — Shahed Ahmed
*Assistant Examiner* — Vicki B. Booker
(74) *Attorney, Agent, or Firm* — Myers Bigel, P.A.

(57) ABSTRACT

Disclosed are a photomask, an exposure apparatus, and a method of fabricating a three-dimensional semiconductor memory device using the same. The photomask may include a mask substrate, a first mask pattern on the mask substrate, and an optical path modulation substrate. The optical path modulation substrate may include a first region on a portion of the first mask pattern, and a second region on another portion of the first mask pattern. The second region has a thickness that is less than a thickness of the first region.

20 Claims, 10 Drawing Sheets

(56) References Cited

U.S. PATENT DOCUMENTS

| | | | |
|---|---|---|---|
| 2006/0256306 A1* | 11/2006 | Lin | G03F 7/70341 355/53 |
| 2013/0260293 A1* | 10/2013 | Misaka | G03F 7/70691 355/72 |
| 2014/0272688 A1 | 9/2014 | Dillion | |
| 2019/0361339 A1* | 11/2019 | Chen | G03F 1/26 |

FOREIGN PATENT DOCUMENTS

| | | |
|---|---|---|
| JP | 4534376 B2 | 9/2010 |
| JP | 5172316 B2 | 3/2013 |
| KR | 100347541 B1 | 8/2002 |

\* cited by examiner

//(1)
PHOTOMASK, EXPOSURE APPARATUS, AND METHOD OF FABRICATING THREE-DIMENSIONAL SEMICONDUCTOR MEMORY DEVICE USING THE SAME

CROSS-REFERENCE TO RELATED APPLICATIONS

This U.S. non-provisional patent application claims priority under 35 U.S.C. § 119 to Korean Patent Application No. 10-2020-0140658, filed on Oct. 27, 2020, in the Korean Intellectual Property Office, the entire contents of which are hereby incorporated by reference.

BACKGROUND OF THE INVENTION

The present disclosure relates to an exposure apparatus and a method of fabricating a semiconductor device using the same, and in particular, to a photomask, an exposure apparatus, and a method of fabricating a three-dimensional semiconductor memory device using the same.

In general, a photolithography process includes a photoresist coating step, an exposing step, and a developing step. The exposing step is a step of transferring an image pattern onto a photoresist layer, which is coated on a flat substrate. As an integration density of a semiconductor device increases, it may be necessary to reduce a wavelength of light used in the exposing step and to increase a numerical aperture of a lens. However, in this case, a depth of focus may be reduced, and it may be necessary to apply an extreme-level planarization technology to the photoresist layer.

SUMMARY

An embodiment of the inventive concept provides a photomask, which is configured to locally change a focal point of light, and an exposure apparatus including the same.

According to an embodiment of the inventive concept, a photomask may include a mask substrate, a first mask pattern on the mask substrate, and an optical path modulation substrate including a first region on a portion of the first mask pattern, and a second region on another portion of the first mask pattern, wherein the second region has a thickness that is less than a thickness of the first region.

According to an embodiment of the inventive concept, an exposure apparatus may include a stage configured to receive a substrate thereon, a light source configured to generate light to be provided onto the substrate on the stage, an objective lens disposed between the light source and the stage and configured to concentrate the light onto the substrate, and a photomask disposed between the objective lens and the light source. The photomask is configured to project a pattern onto the substrate. The photomask may include a mask substrate, a first mask pattern on the mask substrate, and an optical path modulation substrate including a first region on a portion of the first mask pattern, and a second region provided on another portion of the first mask pattern, wherein the second region has a thickness that is less than a thickness of the first region.

According to an embodiment of the inventive concept, a method of fabricating a three-dimensional semiconductor memory device may include forming a layered structure including insulating layers and horizontal layers, which are alternately stacked on a substrate having a cell array region and a connection region, forming a first photoresist pattern exposing a portion of the layered structure on the connection region, forming dummy pad patterns having a stepped shape on the connection region, using etching and trimming processes, in which the first photoresist pattern is used as an etch mask, forming a second photoresist pattern locally exposing the dummy pad patterns, using an exposure apparatus with a photomask, and forming dummy additional layers on the dummy pad patterns. The photomask may include a mask substrate, a first mask pattern on the mask substrate, and an optical path modulation substrate including a first region on a portion of the first mask pattern, and a second region on another portion of the first mask pattern, wherein the second region has a thickness that is less than a thickness of the first region.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Example embodiments of the inventive concepts will now be described more fully with reference to the accompanying drawings, in which example embodiments are shown.

Figure 1:
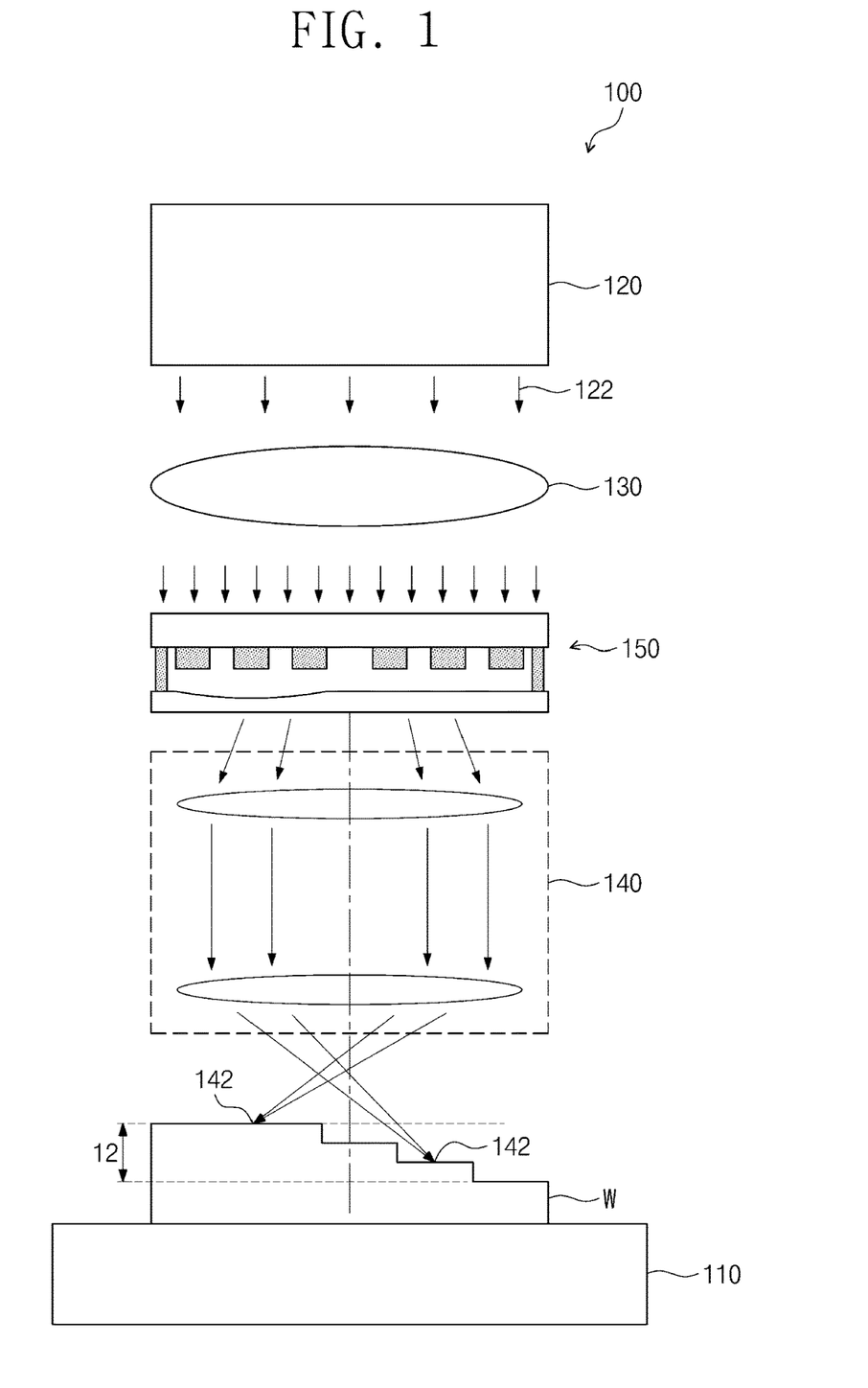
FIG. 1 is a sectional view schematically illustrating an exposure apparatus according to an embodiment of the inventive concept.

FIG. 1 is a sectional view schematically illustrating an example of an exposure apparatus 100 according to an embodiment of the inventive concept.

Referring to FIG. 1, the exposure apparatus 100 may be a deep ultra-violet (DUV) exposure apparatus. As an example, the exposure apparatus 100 may include a stage 110, a light source 120, an optical system 130, an objective lens 140, and a photomask 150.

The stage 110 may be configured to load a substrate W thereon. The stage 110 may also be configured to move the substrate W in a horizontal direction. The substrate W may have a stepped top surface, as illustrated in FIG. 1. The stepped top surface of the substrate W may have a height difference 12 ranging from about 1 µm to about 10 µm. For example, a portion of the substrate W may have a top surface that is higher in the vertical direction than another portion of the substrate W by between about 1 µm to about 10 µm.

The light source 120 may be provided on the stage 110. The light source 120 may be configured to produce light 122 and to provide the light 122 to the substrate W. The light 122 may include an excimer laser or a deep ultraviolet light. For example, the light 122 may have a wavelength of 193 nm (ArF), 248 nm (KrF), 365 nm (i-line), or 436 nm (G-line).

The optical system 130 may be provided between the light source 120 and the stage 110. The optical system 130 may include, for example, a lens. The optical system 130 may be configured to project the light 122 onto the photomask 150 in an enlargement and/or reduction manner. Alternatively, the optical system 130 may include a mirror, but the inventive concept is not limited to this example. In an embodiment, the optical system 130 may be configured to change a propagation path of the light 122 and/or to collimate the light 122.

The objective lens 140 may be provided between the stage 110 and the optical system 130. The objective lens 140 may be configured to concentrate the light 122 onto a specific region of the substrate W. The objective lens 140 may include, for example, at least one convex lens.

The photomask 150 may be provided between the objective lens 140 and the optical system 130. As an example, the photomask 150 may be a transmission-type photomask. The photomask 150 may be used to project the light 122 onto a specific region of the substrate W. The photomask 150 may be configured to cause a spatial variation in optical path of the light 122. For example, the photomask 150 may shift a focal length of the objective lens 140 to locate a focal point 142 of the light 122 on the stepped top surface of the substrate W.

Figure 2:
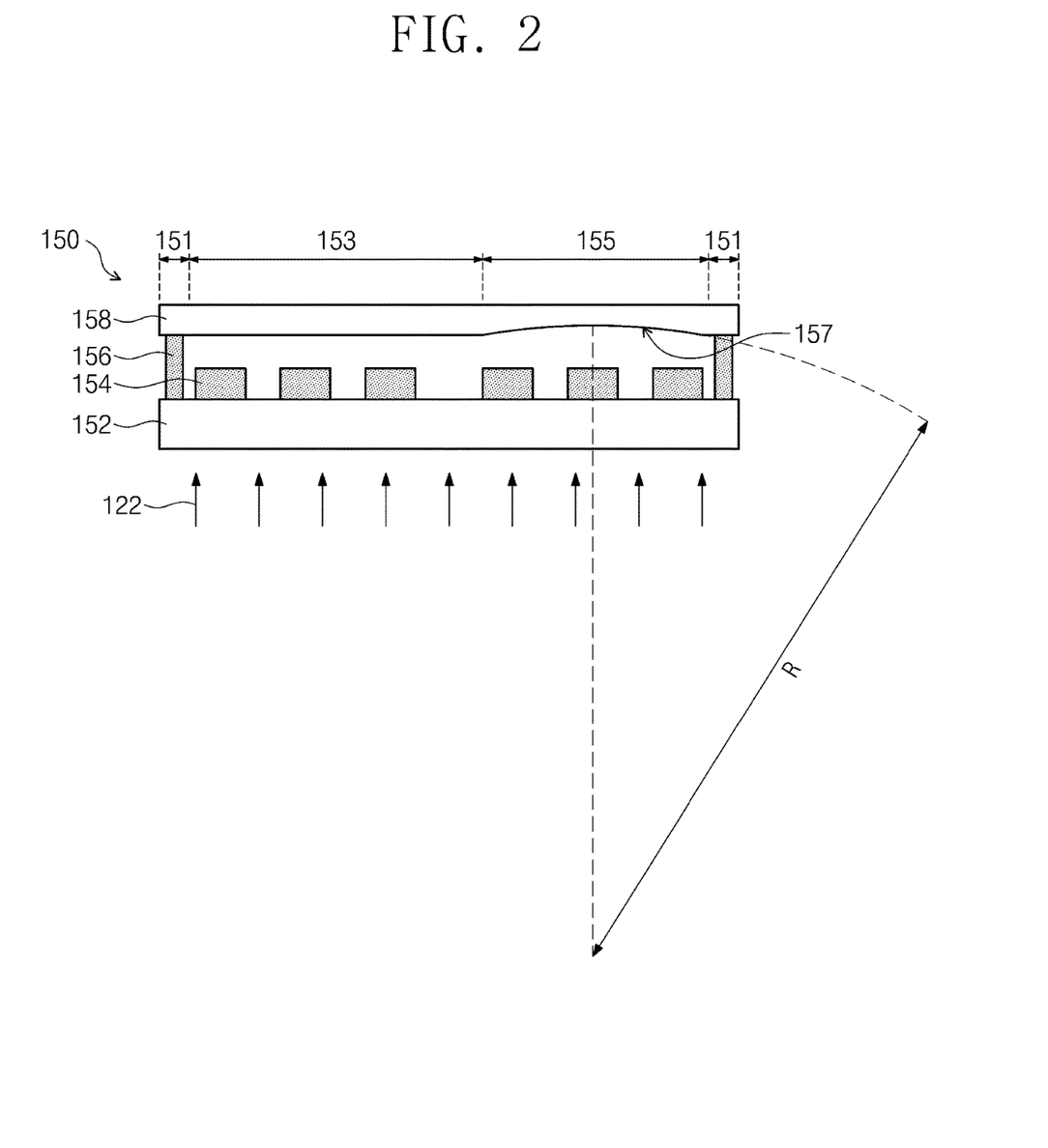
FIG. 2 is a sectional view illustrating an example of the photomask of FIG. 1.

FIG. 2 illustrates an example of the photomask 150 of FIG. 1.

Referring to FIG. 2, the photomask 150 may include a mask substrate 152, a first mask pattern 154, a supporting portion 156, and an optical path modulation substrate 158.

The mask substrate 152 may be a transparent substrate. For example, the mask substrate 152 may be formed of or include quartz. Alternatively, the mask substrate 152 may be formed of or include glass, but the inventive concept is not limited to this example.

The first mask pattern 154 may be disposed on the mask substrate 152. The first mask pattern 154 may absorb and block a portion of the light 122, which is provided to the mask substrate 152. The light 122, which is made by the first mask pattern 154, may be projected onto the substrate W. An intensity of the light 122 may be variable. For example, the first mask pattern 154 may be formed of or include a metallic material (e.g., chromium).

The supporting portion 156 may be provided on an edge of the mask substrate 152 that is located outside the first mask pattern 154. The supporting portion 156 may be provided between the mask substrate 152 and the optical path modulation substrate 158. The supporting portion 156 may be configured to fasten the optical path modulation substrate 158 to the mask substrate 152. In an embodiment, the supporting portion 156 may be formed of or include at least one of, for example, sealants or adhesives. In an embodiment, the supporting portion 156 may be formed of or include a polymeric material, but the inventive concept is not limited to this example.

The optical path modulation substrate 158 may be disposed on the first mask pattern 154 and the supporting portion 156. The optical path modulation substrate 158 may be transparent to light 122, and thus, light 122 may be incident into the mask substrate 152 through the optical path modulation substrate 158. The optical path modulation substrate 158 may be formed of or include the same material as the mask substrate 152. For example, the optical path modulation substrate 158 may be formed of or include quartz. The optical path modulation substrate 158 may be configured to locally change the focal point 142 of the light 122, which is incident into the objective lens 140. As an example, the optical path modulation substrate 158 may have an edge region 151, a flat first region 153, and a non-flat second region 155, as illustrated in FIG. 2.

The edge region 151 may be disposed outside the flat first region 153 and the non-flat second region 155, as illustrated in FIG. 2 (i.e., the edge region 151 may be defined by the outer peripheral edge portion of the optical path modulation substrate 158). The edge region 151 may be provided on the supporting portion 156. The edge region 151 may be a non-transmission region to the light 122.

The flat first region 153 may be provided on a portion of the first mask pattern 154 (i.e., as illustrated in FIG. 2, the flat first region 153 is positioned above the first mask pattern 154). The flat first region 153 may be parallel to the mask substrate 152. In the flat first region 153, the optical path modulation substrate 158 may have top and bottom surfaces that are parallel to each other. The flat first region 153 of the optical path modulation substrate 158 may be configured to transmit the light 122 without a variation of the optical path of the light 122.

The non-flat second region 155 may be provided on another portion of the first mask pattern 154. The non-flat second region 155 may be thinner than the flat first region 153, as illustrated in FIG. 2 (i.e., a thickness of the non-flat second region 155 is less than a thickness of the flat first region 153). In the non-flat second region 155, the top and bottom surfaces of the optical path modulation substrate 158 may not be parallel to each other. The non-flat second region 155 of the optical path modulation substrate 158 may be configured to vary or change the propagation path of the light 122 and thereby locally change the focal point 142 of the light 122. As an example, the non-flat second region 155 may include a recess 157 in the bottom surface thereof, as illustrated in FIG. 2.

The recess 157 may be provided adjacent to the first mask pattern 154. The recess 157 may be provided on the bottom surface of the optical path modulation substrate 158. The top surface of the optical path modulation substrate 158 may be flat. The recess 157 may have a curvature radius R. When the stepped top surface of the substrate W has the height difference 12 of about 1 μm to about 10 μm, the curvature radius R may range from about 160 cm to 1400 cm. The recess 157 may locally change an optical path of light through the optical path modulation substrate 158, and thus, the focal point 142 of the light 122 may be shifted.

Figure 3:
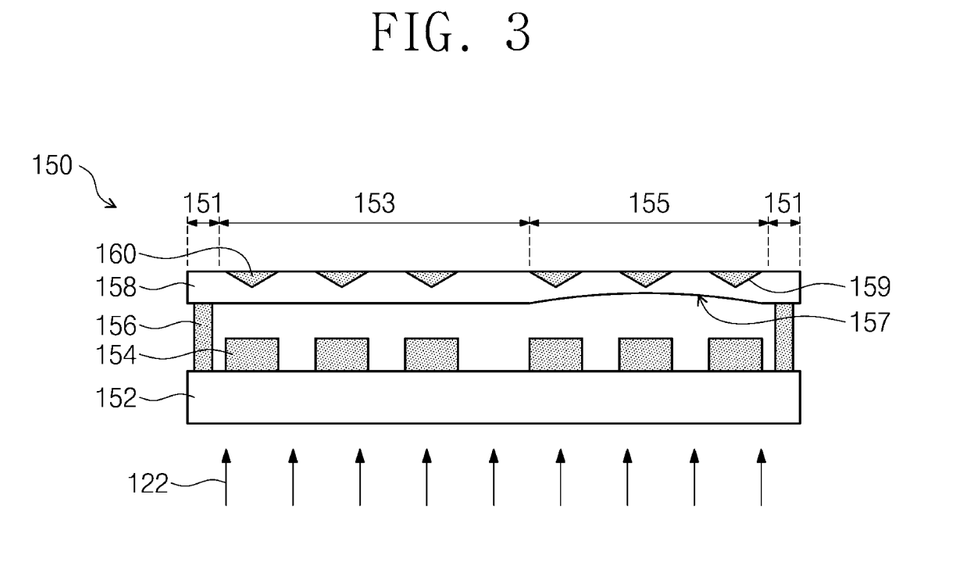
FIG. 3 is a sectional view illustrating an example of the photomask of FIG. 1.

FIG. 3 illustrates an example of the photomask 150 of FIG. 1.

Referring to FIG. 3, the photomask 150 may further include a second mask pattern 160. The second mask pattern 160 may be provided on the optical path modulation substrate 158. In an embodiment, the second mask pattern 160 may have the same area and/or size as the first mask pattern 154. The second mask pattern 160 may be aligned with the first mask pattern 154, as illustrated in FIG. 3.

The second mask pattern 160 may remove distortion of the light 122, which occurs when the light 122 passes through the optical path modulation substrate 158. The second mask pattern 160 may be formed of or include a metallic material (e.g., chromium). The second mask pattern 160 may be provided in the optical path modulation substrate 158.

The optical path modulation substrate 158 may have a trench 159, and the second mask pattern 160 may be provided in the trench 159. For example, the second mask pattern 160 may have a triangular crosssection, as illustrated in FIG. 3. The trench 159 may be provided on the top surface of the optical path modulation substrate 158, and the recess 157 may be provided on the bottom surface of the optical path modulation substrate 158. In the illustrated embodiment of FIG. 3, the optical path modulation substrate 158 includes a plurality of trenches 159 and a corresponding plurality of elements in the trenches 159 (i.e., the second mask pattern 160 includes a repetition of a trench and corresponding element therein).

The mask substrate 152, the first mask pattern 154, and the supporting portion 156 may be configured to have substantially the same features as the embodiment of FIG. 2.

Figure 4:
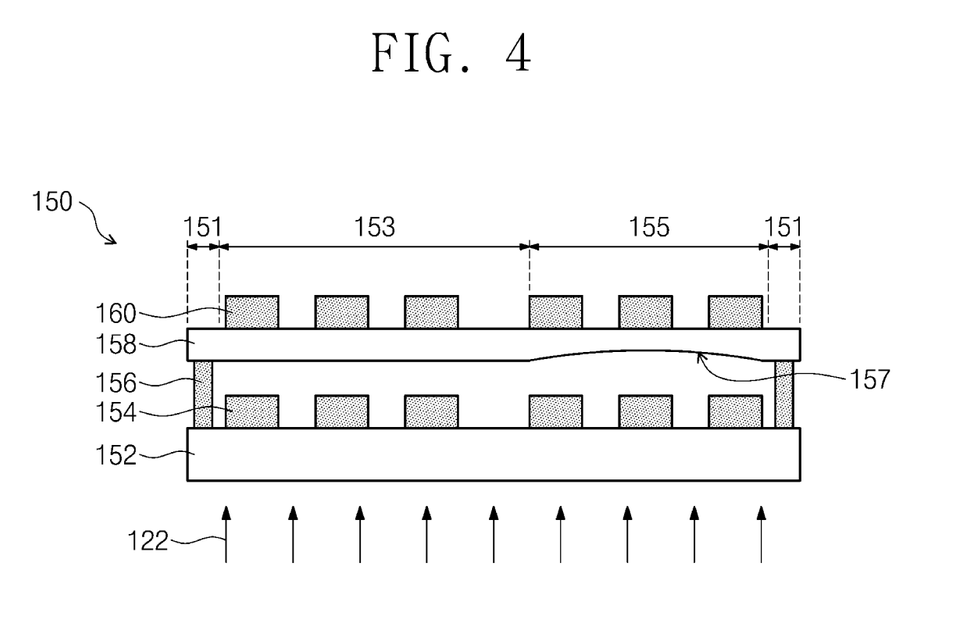
FIG. 4 is a sectional view illustrating an example of the photomask of FIG. 1.

FIG. 4 illustrates an example of the photomask 150 of FIG. 1.

Referring to FIG. 4, the second mask pattern 160 of the photomask 150 may be provided on the flat top surface of the optical path modulation substrate 158. The second mask pattern 160 may have the same sectional shape as the first mask pattern 154. The second mask pattern 160 may have a rectangular or square section, as illustrated in FIG. 4.

The mask substrate 152, the first mask pattern 154, the supporting portion 156, and the optical path modulation substrate 158 may have substantially the same features as the embodiment of FIG. 2.

Hereinafter, a method of fabricating a three-dimensional semiconductor memory device using the exposure apparatus 100 will be described in more detail.

Figure 5:
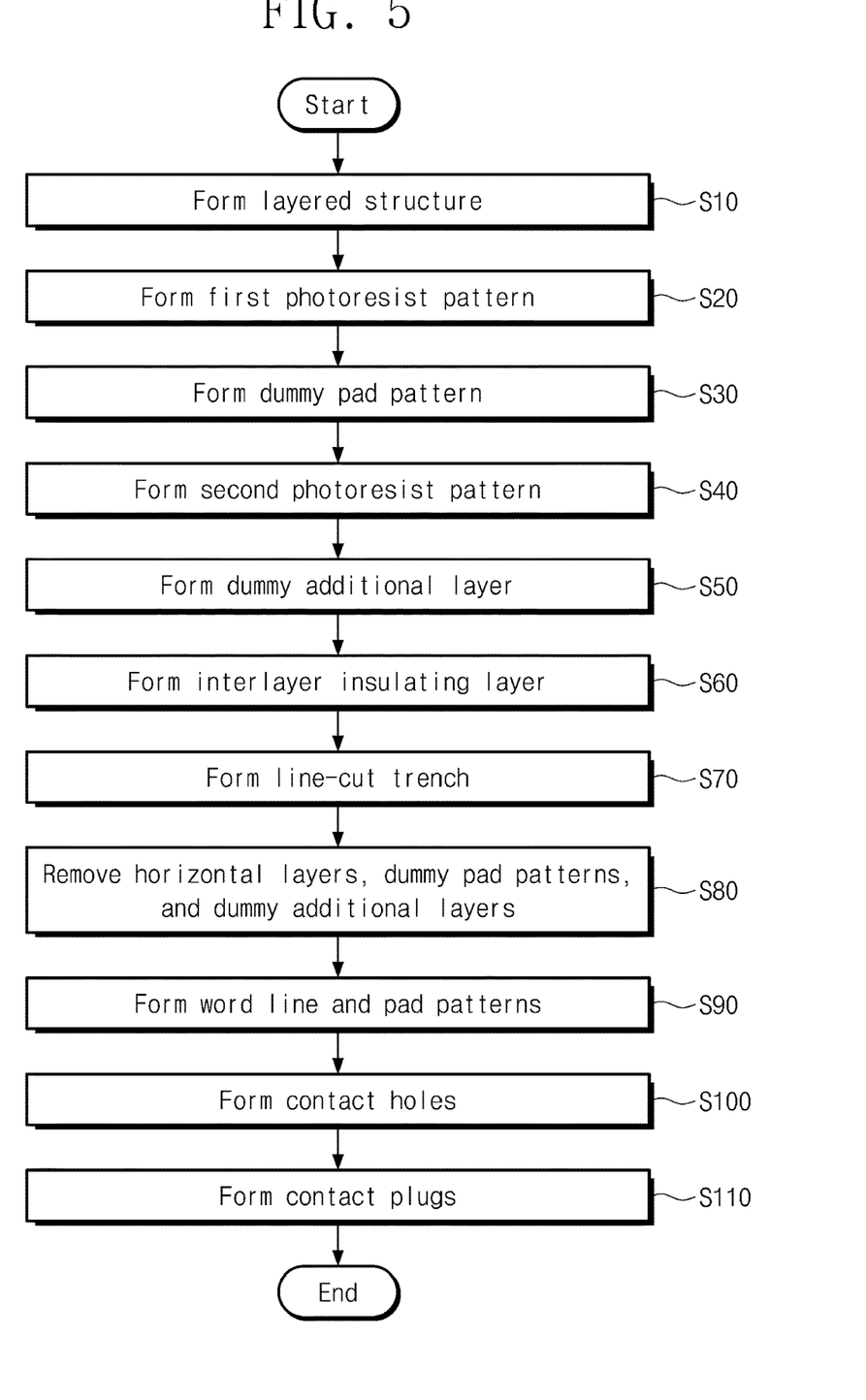
FIG. 5 is a flow chart illustrating a method of fabricating a three-dimensional semiconductor memory device, according to an embodiment of the inventive concept.

FIG. 5 is a flow chart illustrating a method of fabricating a three-dimensional semiconductor memory device, according to an embodiment of the inventive concept. FIGS. 6 to 14 are sectional views illustrating a process of fabricating a three-dimensional semiconductor memory device, according to the method of FIG. 5.

Figure 6:
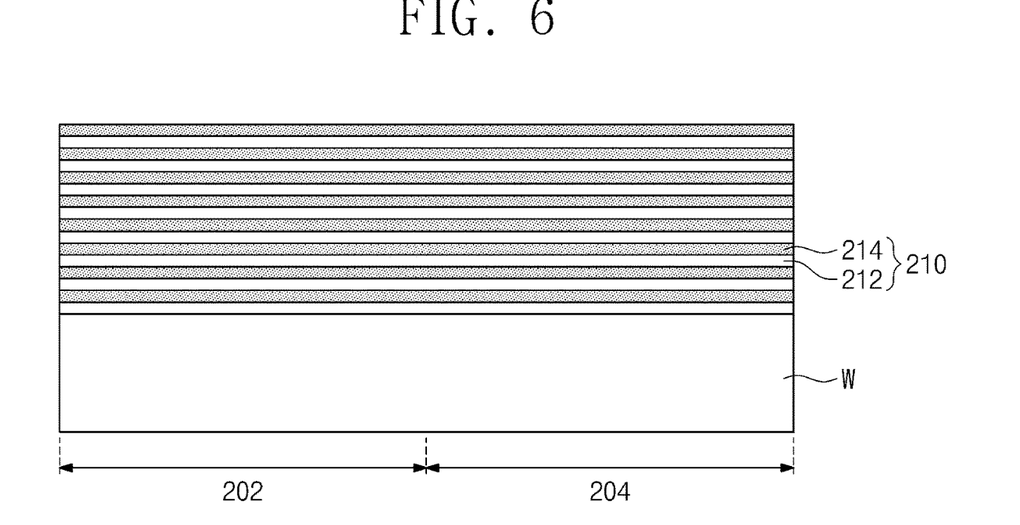
FIGS. 6 to 14 are sectional views illustrating a process of fabricating a three-dimensional semiconductor memory device, according to the method of FIG. 5.

Referring to FIGS. 5 and 6, a layered structure 210 may be formed on the substrate W (in S10). The substrate W may include a cell array region 202 and a connection region 204. The cell array region 202 may be a region, on which memory cells are formed. The connection region 204 may be provided near or around the cell array region 202. The connection region 204 may be a region, on which contact plugs 260 (e.g., see FIG. 14) are formed, and here, the contact plugs 260 may be connected to the memory cells through the word lines WL (e.g., see FIG. 12). The layered structure 210 may be formed on the cell array region 202 and the connection region 204. The layered structure 210 may include mold insulating layers. For example, the layered structure 210 may include insulating layers 212 and horizontal layers 214. The insulating layers 212 and the horizontal layers 214 may be alternately stacked on the cell array region 202 and the connection region 204. The insulating layers 212 may be formed of or include silicon oxide. The horizontal layers 214 may be formed of or include at least one of silicon nitride, silicon oxynitride, poly silicon, or metallic materials.

Figure 7:
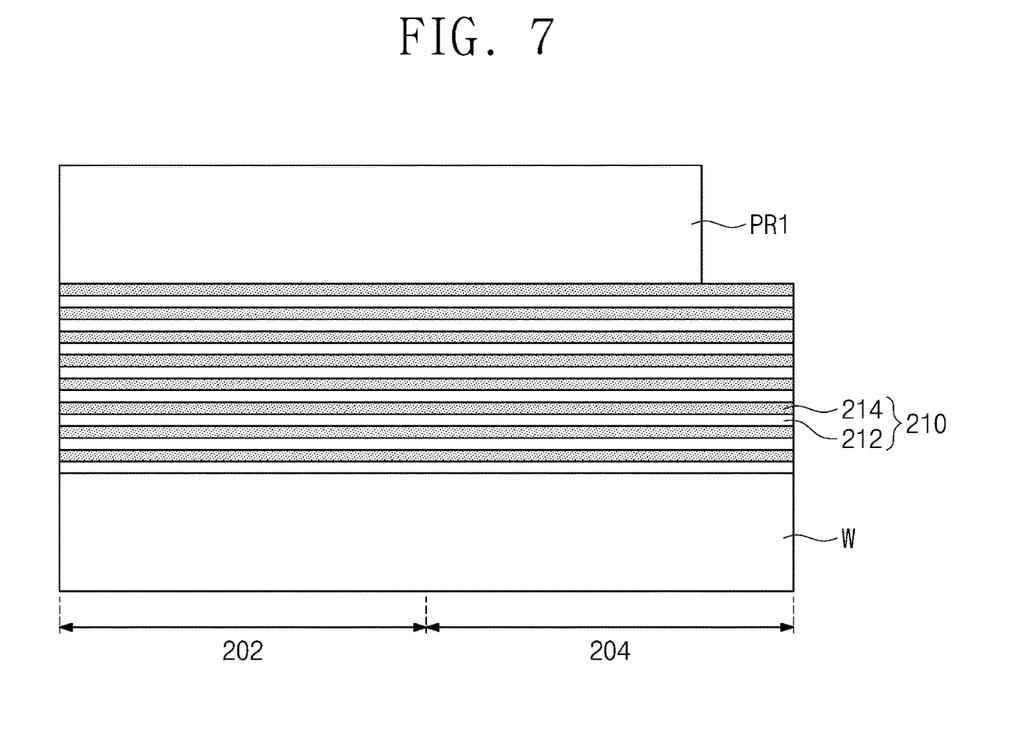

Referring to FIGS. 5 and 7, a first photoresist pattern PR1 may be formed to expose a portion of the layered structure 210 located on the connection region 204 (in S20). The first photoresist pattern PR1 may be formed by performing a coating process, an exposing process, and a developing process on a first photoresist layer (not shown). In an embodiment, the first photoresist pattern PR1 may expose a portion of the layered structure 210 located on an edge of the connection region 204.

Figure 8:
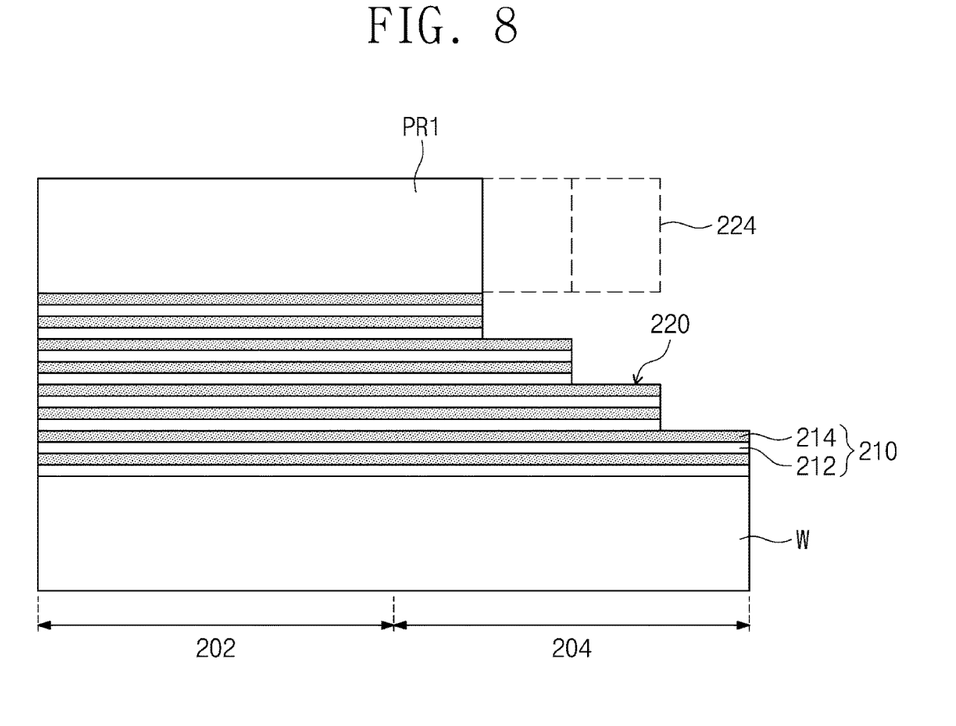

Referring to FIGS. 5 and 8, dummy pad patterns 220 may be formed by etching and trimming processes, in which the first photoresist pattern PR1 is used as an etch mask (in S30).

In an embodiment, the number of the dummy pad patterns 220 may be determined by the iteration number of the etching and trimming processes. The dummy pad patterns 220 may have a stepped shape, as illustrated in FIG. 8. A portion of the first photoresist pattern PR1 may be horizontally removed by the trimming process. In FIG. 8, the reference number "224" depicts the portion of the first photoresist pattern PR1 removed by the trimming process. Each of the dummy pad patterns 220 may refer to an end portion of the horizontal layers 214.

Thereafter, the first photoresist pattern PR1 may be removed by an ashing or cleaning process.

Figure 9:
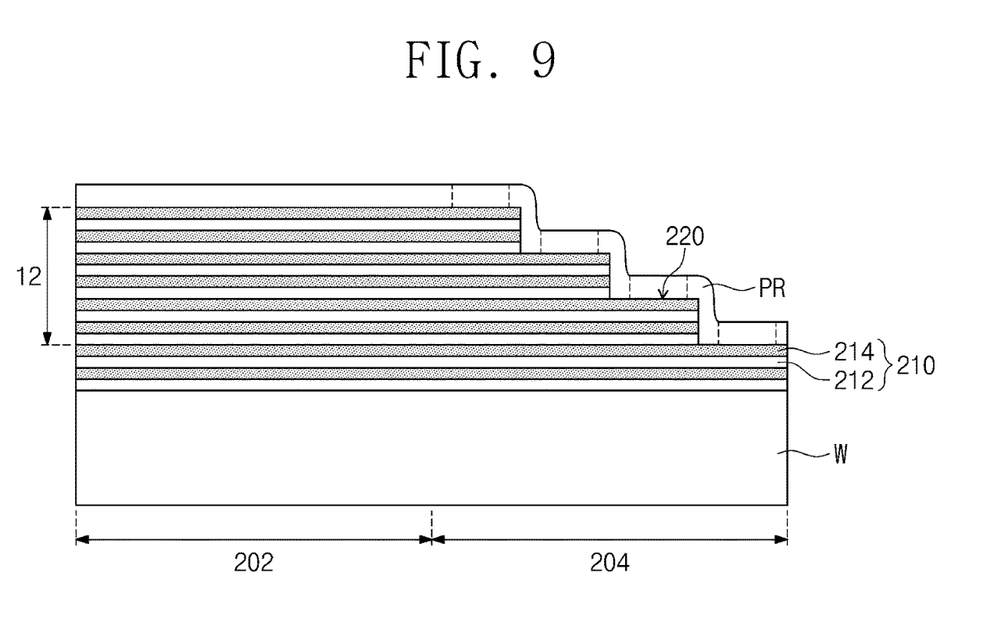

Referring to FIGS. 1, 2, 5, 9, and 10, second photoresist patterns PR2 may be formed on side surfaces of the dummy pad patterns 220, and the exposure apparatus 100 with the photomask 150 may be used to form the second photoresist patterns PR2 (in S40). The second photoresist pattern PR2 may be formed by performing a coating process, an exposing process and a developing process on a second photoresist layer PR (FIG. 9). The coating process may include a spin coating process. The second photoresist pattern PR2 (FIG. 10) and the second photoresist layer PR (FIG. 9) may be thinner than the first photoresist pattern PR1 and the first photoresist layer.

Referring to FIGS. 1, 2, and 9, the exposure apparatus 100 may provide light 122 onto the second photoresist layer PR, which is provided on the dummy pad patterns 220, using the optical path modulation substrate 158 of the photomask 150. Due to the presence of the recess 157 on the non-flat region 155, the optical path modulation substrate 158 may be used to perform an exposing process effectively on portions of the second photoresist layer PR, which are located on the dummy pad patterns 220. That is, the portions of the second photoresist layer PR on the dummy pad patterns 220 may be effectively exposed by the light 122. The curvature radius R of the recess 157, which determines the focal point 142 of the light 122, may be determined in consideration of the height difference 12 of the dummy pad patterns 220. The height difference 12 may be defined as a difference between the highest and lowest heights of the dummy pad patterns 220.

Figure 15:
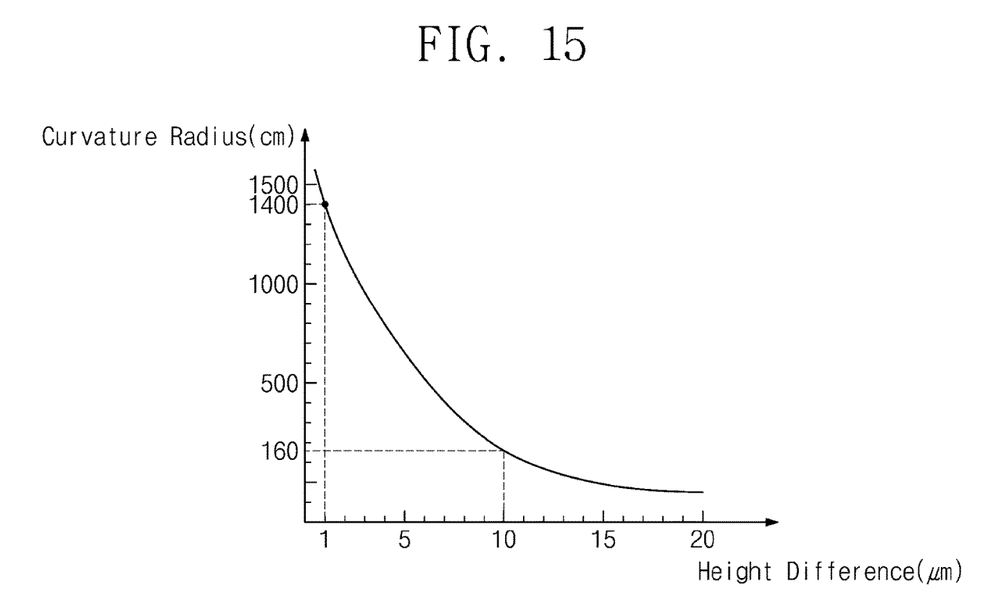
FIG. 15 is a graph showing a variation in curvature radius of a recess, caused by a difference in height between the dummy pad patterns of FIG. 8.

FIG. 15 is a graph showing a variation in the curvature radius R of the recess 157 in an optical path modulation substrate 158 caused by the height difference 12 of the dummy pad patterns 220 of FIG. 8.

Referring to FIG. 15, in the case where the height difference 12 between the topmost and bottommost ones of the dummy pad patterns 220 is within a range of about 1 μm to about 10 μm, the curvature radius R of the recess 157 may range from about 160 cm to about 1400 cm. For the dummy pad patterns 220 having the height difference 12 of 1 μm or smaller, the recess 157 may have the curvature radius R of about 1400 cm or larger, and for the dummy pad patterns 220 having the height difference 12 of 10 μm or larger, the recess 157 may have the curvature radius R of about 160 cm or smaller.

Figure 10:
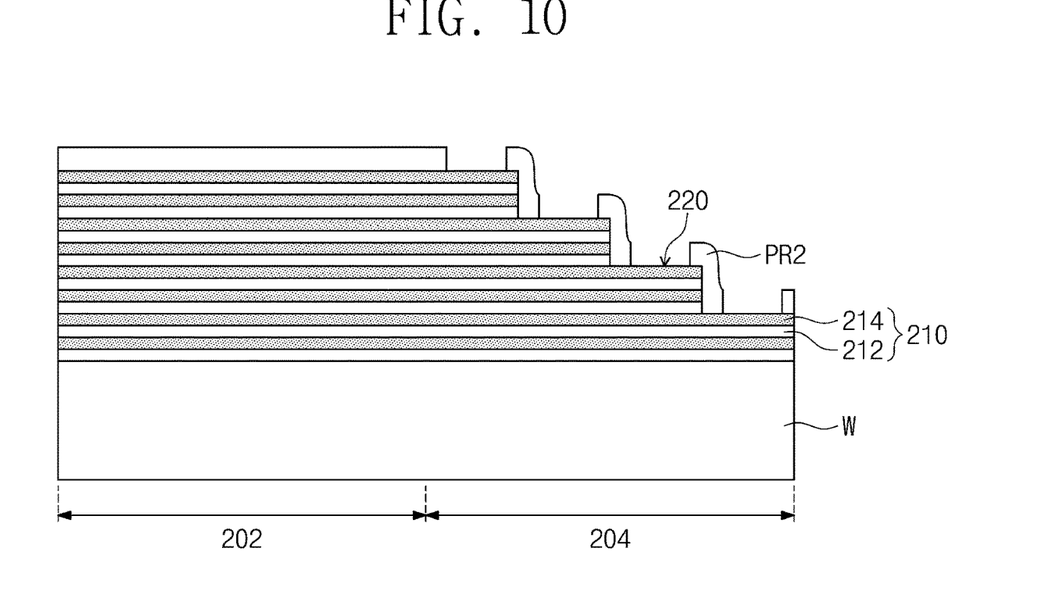

Referring to FIG. 10, the second photoresist patterns PR2 may be formed by removing the portions of the second photoresist layer PR, which are exposed by the light 122, through a developing process. The second photoresist patterns PR2 may be formed to expose top surfaces of the dummy pad patterns 220, respectively.

Figure 11:
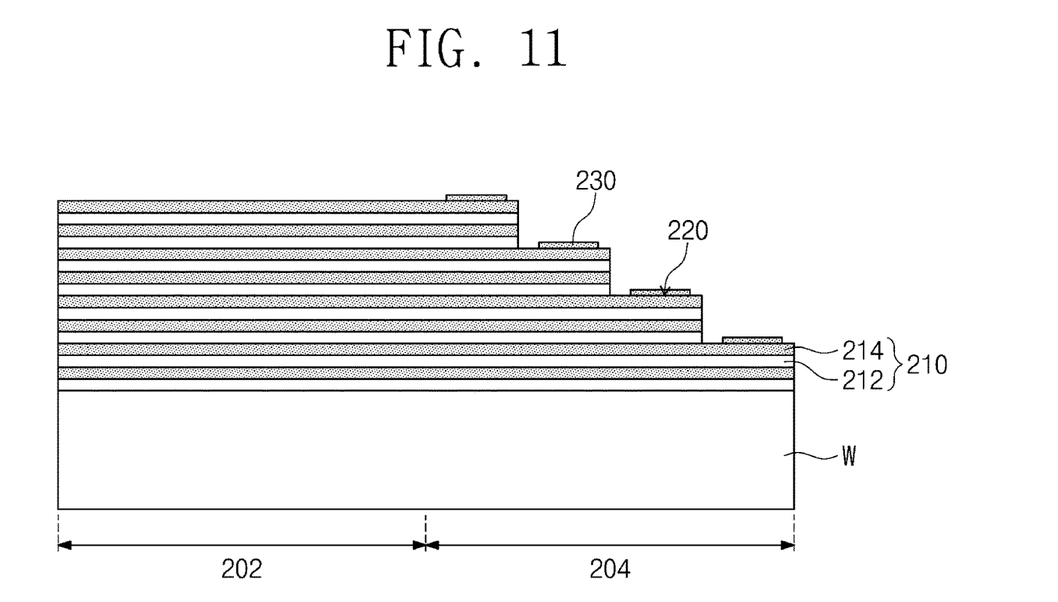

Referring to FIGS. 5 and 11, dummy additional layers 230 may be formed on exposed top surfaces of the dummy pad patterns 220 (in S50). The dummy additional layers 230 may include pad patterns which are raised from the dummy pad patterns 220. The dummy additional layers 230 may be formed of or include the same material (e.g., silicon nitride) as the horizontal layers 214. Thereafter, the second photoresist pattern PR2 may be removed by an ashing process or a cleaning process.

Although not shown, channel holes and channel structures, which are provided in the channel holes, may be formed in the cell array region 202.

Figure 12:
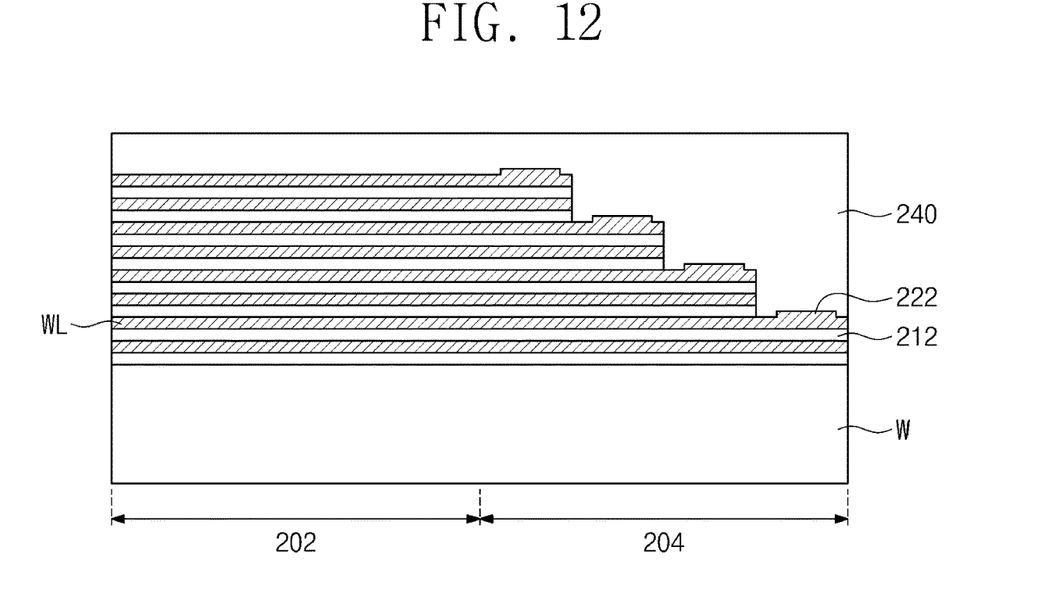

Referring to FIGS. 5 and 12, an interlayer insulating layer 240 may be formed on the layered structure 210, the dummy pad patterns 220, and the dummy additional layers 230 (in S60). The interlayer insulating layer 240 may include a silicon oxide layer, which is formed by a chemical vapor deposition method.

Figure 16:
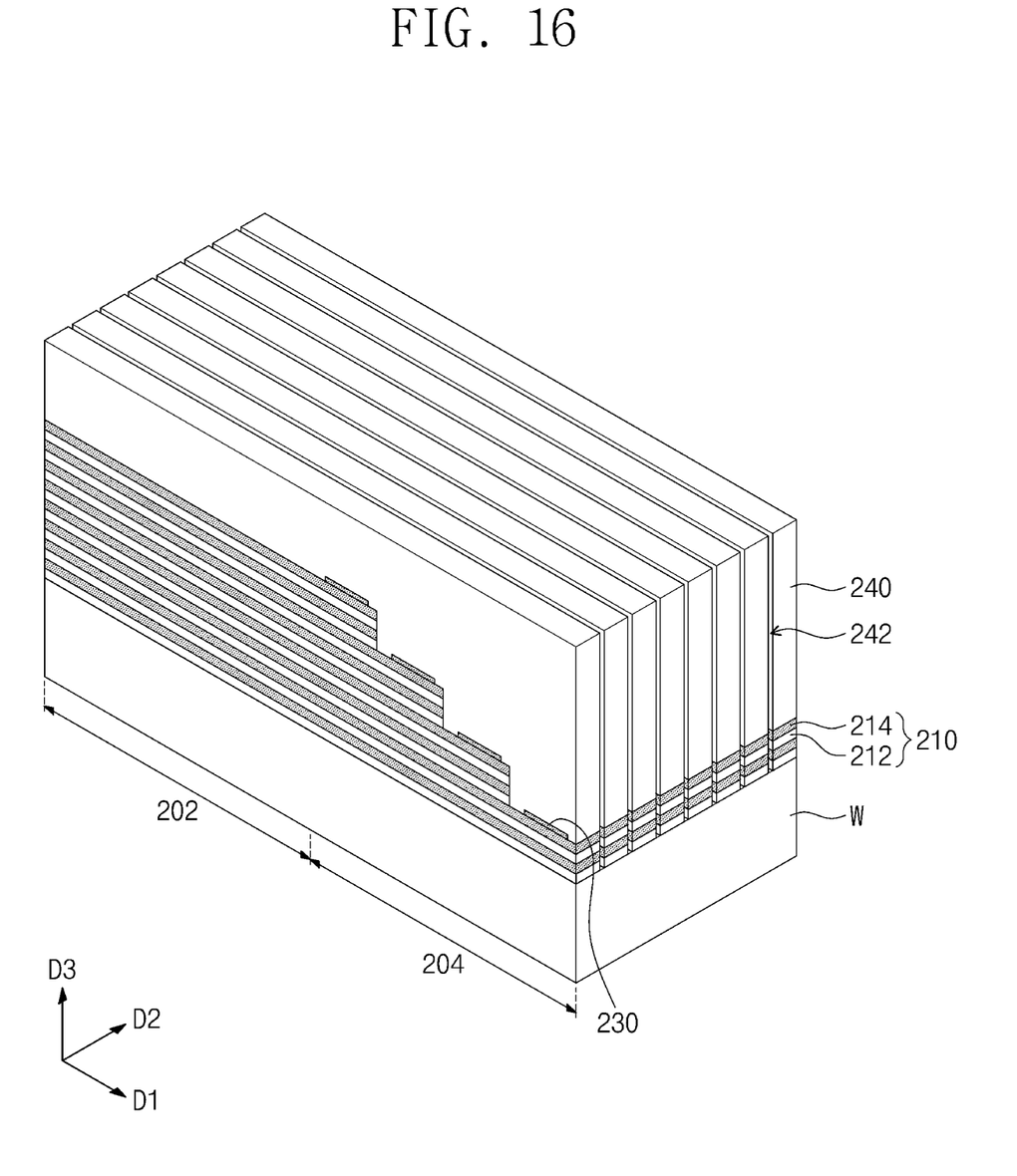
FIG. 16 is a perspective view exemplarily illustrating line-cut trenches provided in the interlayer insulating layer of FIG. 12.

FIG. 16 is a perspective view exemplarily illustrating line-cut trenches 242 provided in the interlayer insulating layer 240 of FIG. 12.

Referring to FIGS. 5, 12, and 16, the line-cut trenches 242 may be formed by removing portions of the interlayer insulating layer 240, the layered structure 210, the dummy pad patterns 220, and the dummy additional layers 230 (in S70). The line-cut trenches 242 may be formed through a photolithography process and an etching process. The line-cut trenches 242 may be formed to separate each of the insulating layers 212, the horizontal layers 214, the dummy pad patterns 220, and the dummy additional layers 230 from each other in a second direction D2. The line-cut trenches 242 may be formed to expose side surfaces of the horizontal layers 214, the dummy pad patterns 220, and the dummy additional layers 230. The insulating layers 212, the horizontal layers 214, the dummy pad patterns 220, and the dummy additional layers 230 may be extended in a first direction D1.

Thereafter, the horizontal layers 214, the dummy pad patterns 220, and the dummy additional layers 230, which are exposed through the line-cut trench 242, may be removed (in S80). The horizontal layers 214, the dummy pad patterns 220, and the dummy additional layers 230 may be removed by a wet etching method.

Next, word lines WL and pad patterns 222 may be formed in regions, which are formed by removing the horizontal layers 214, the dummy pad patterns 220, and the dummy additional layers 230 (in S90). The word lines WL and the pad patterns 222 may be formed on the insulating layers 212 by an atomic layer deposition method. The word lines WL and the pad patterns 222 may be formed of or include at least one of metallic materials (e.g., tungsten). The pad patterns 222 may be formed at ends of the word lines WL to have a stepped shape.

Figure 13:
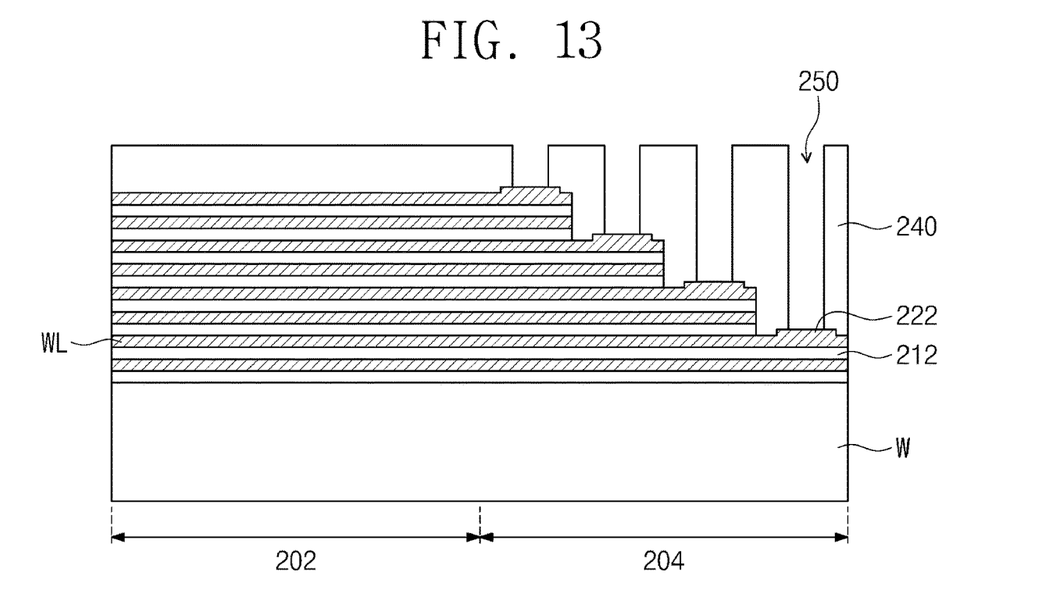

Referring to FIGS. 5 and 13, contact holes 250 may be formed by removing a portion of the interlayer insulating layer 240 (in S100). The contact holes 250 may be formed to expose the pad patterns 222, respectively.

Figure 14:
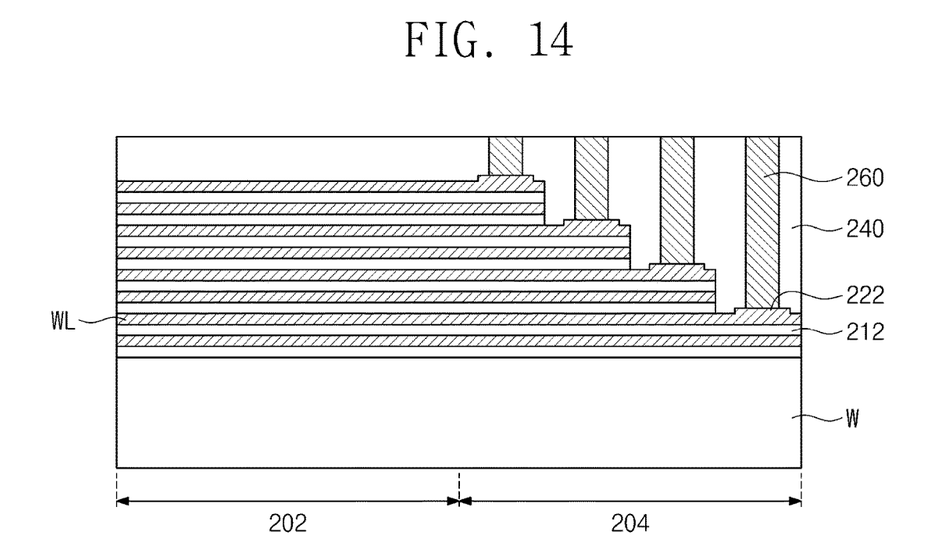

Referring to FIGS. 5 and 14, the contact plugs 260 may be formed in the contact holes 250 (in S110). In an embodiment, the contact plugs 260 may be formed in the contact holes 250 by sequentially performing a metal deposition process and a chemical mechanical polishing process.

Although not shown, an interconnection layer may be formed on the contact plugs 260.

Thus, in the method of fabricating a three-dimensional semiconductor memory device according to an embodiment of the inventive concept, the photomask 150 may be configured to cause a local variation of a focal length of the light 122, and in this case, the photomask 150 may be used to form the dummy pad patterns 220 and the dummy additional layers 230 in a stepped shape and to form the pad patterns 222 in a stepped shape on ends of the word lines WL.

According to an embodiment of the inventive concept, a photomask may include an optical path modulation substrate with a recessed portion, and this substrate may be used to realize a local variation in a focal point of light to be incident into the photomask.

While example embodiments of the inventive concept have been particularly shown and described, it will be understood by one of ordinary skill in the art that variations in form and detail may be made therein without departing from the scope of the attached claims.

What is claimed is:

1. A photomask, comprising:
a mask substrate;
a first mask pattern on the mask substrate; and
an optical path modulation substrate comprising a first region on a portion of the first mask pattern, and a second region on another portion of the first mask pattern, wherein the second region comprises opposite first and second surfaces that are not parallel to each other and has a thickness that is less than a thickness of the first region.

2. The photomask of claim 1, wherein the second region comprises a recess in one of the first and second surfaces.

3. The photomask of claim 2, wherein the recess has a curvature radius ranging from 160 cm to 1400 cm.

4. The photomask of claim 1, further comprising a second mask pattern on the first region and the second region of the optical path modulation substrate.

5. The photomask of claim 4, wherein the second mask pattern is aligned with the first mask pattern.

6. The photomask of claim 4, wherein the first surface- comprises a trench, and
wherein the second mask pattern is disposed in the trench, and wherein the second surface comprises a recess in the second region of the optical path modulation substrate.

7. The photomask of claim 4, wherein the second mask pattern has a triangular cross-section.

8. The photomask of claim 1, further comprising a supporting portion disposed on an edge of the mask substrate, wherein the supporting portion supports the optical path modulation substrate.

9. The photomask of claim 8, wherein the supporting portion comprises at least one of a sealant or an adhesive.

10. The photomask of claim 1, wherein the mask substrate and the optical path modulation substrate comprise quartz.

11. An exposure apparatus, comprising:
a stage configured to receive a substrate thereon;
a light source configured to generate light to be provided onto the substrate on the stage;
an objective lens disposed between the light source and the stage and configured to concentrate the light onto the substrate; and
a photomask disposed between the objective lens and the light source, wherein the photomask is configured to project a pattern onto the substrate,
wherein the photomask comprises:
a mask substrate;
a first mask pattern on the mask substrate; and
an optical path modulation substrate comprising a first region on a portion of the first mask pattern, and a second region on another portion of the first mask pattern, wherein the second region comprises opposite first and second surfaces that are not parallel to each other and has a thickness that is less than a thickness of the first region.

12. The exposure apparatus of claim 11, wherein the second region comprises a recess in one of the first and second surfaces, and wherein the recess has a curvature radius ranging from 160 cm to 1400 cm.

13. The exposure apparatus of claim 11, wherein the photomask further comprises a second mask pattern on the first region and the second region of the optical path modulation substrate, wherein the second mask pattern is aligned with the first mask pattern.

14. The exposure apparatus of claim 13, wherein the first mask pattern and the second mask pattern comprise chromium.

15. The exposure apparatus of claim 11, wherein the mask substrate and the optical path modulation substrate comprise quartz.

16. A method of fabricating a three-dimensional semiconductor memory device, the method comprising:
   forming a layered structure including insulating layers and horizontal layers, which are alternately stacked on a substrate having a cell array region and a connection region;
   forming a first photoresist pattern exposing a portion of the layered structure on the connection region;
   forming dummy pad patterns having a stepped shape on the connection region, using etching and trimming processes, in which the first photoresist pattern is used as an etch mask;
   forming a second photoresist pattern locally exposing the dummy pad patterns, using an exposure apparatus with a photomask; and
   forming dummy additional layers on the dummy pad patterns,
wherein the photomask comprises:
   a mask substrate;
   a first mask pattern on the mask substrate; and
   an optical path modulation substrate comprising a first region on a portion of the first mask pattern, and a second region on another portion of the first mask pattern, wherein the second region comprises opposite first and second surfaces that are not parallel to each other and has a thickness that is less than a thickness of the first region.

17. The method of claim 16, further comprising:
   forming an interlayer insulating layer covering the dummy pad patterns and the dummy additional layers on the connection region and the layered structure on the cell array region; and
   partially removing the interlayer insulating layer, the layered structure, the dummy pad patterns, and the dummy additional layers to form line-cut trenches.

18. The method of claim 17, further comprising:
   removing the horizontal layers, the dummy pad patterns, and the dummy additional layers exposed by the line-cut trenches; and
   forming word lines and pad patterns in regions, which are formed by removing the horizontal layers, the dummy pad patterns, and the dummy additional layers.

19. The method of claim 18, further comprising:
   forming contact holes in the interlayer insulating layer to expose the pad patterns; and
   forming contact plugs in the contact holes.

20. The method of claim 16, wherein the second photoresist pattern is thinner than the first photoresist pattern.

* * * * *